United States Patent
Kim et al.

(10) Patent No.: US 9,337,425 B2
(45) Date of Patent: May 10, 2016

(54) METHOD OF MANUFACTURING RESISTANCE CHANGE LAYER USING IRRADIATION OF ELECTRON BEAM AND RESISTIVE RANDOM ACCESS MEMORY DEVICE USING THE SAME

(71) Applicant: INDUSTRY-UNIVERSITY COOPERATION FOUNDATION HANYANG UNIVERSITY, Seoul (KR)

(72) Inventors: Eun Kyu Kim, Seoul (KR); Dong Uk Lee, Incheon (KR); Seong Guk Cho, Seoul (KR); Gyu Jin Oh, Seoul (KR); Byung Cheol Lee, Seoul (KR); Dongwook Kim, Suwon-si (KR); Sang Woo Pak, Seoul (KR); Hyung Dal Park, Daejeon (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 14/230,543

(22) Filed: Mar. 31, 2014

(65) Prior Publication Data

US 2015/0044816 A1 Feb. 12, 2015

(30) Foreign Application Priority Data

Aug. 9, 2013 (KR) .......................... 10-2013-0094637

(51) Int. Cl.
*H01L 45/00* (2006.01)
(52) U.S. Cl.
CPC ............ *H01L 45/1641* (2013.01); *H01L 45/08* (2013.01); *H01L 45/1233* (2013.01); *H01L 45/146* (2013.01)

(58) Field of Classification Search
None
See application file for complete search history.

(56) References Cited

PUBLICATIONS

Lee et. al., Electrical properties of metal-oxide nano-particles embedded in ZnO layer on the Pt/glass substrate after 0.2 MeV electron beam irradiation, ISPlasma Jan. 28, 2013-Feb. 1, 2013, Nagoya, Japan.*
Dong Uk Lee, et al; "Electrical properties of ZnO film with In2O3 nanoparticles during 0.2 MeV electron beam irradations", The Korean Physical Society, 3 pages, Apr. 24, 2013.

(Continued)

*Primary Examiner* — Andres Munoz
(74) *Attorney, Agent, or Firm* — Ladas & Parry LLP

(57) ABSTRACT

Methods of manufacturing a resistance change layer and a resistive random access memory device are provided. The method of manufacturing a resistance change layer includes forming a preliminary resistance change layer including an oxide semiconductor material on a substrate and irradiating the preliminary resistance change layer with an electron beam to a predetermined depth. On a path along which the electron beam is irradiated, a composition ratio of the resistance change layer changes in a direction in which a density of oxygen vacancies of the oxide semiconductor material increases. Accordingly, the composition ratio of a resistance change layer is easily controlled using electron beam irradiation. In addition, since interfacial surface roughness and internal defect structures of an oxide semiconductor are controlled by electron beam irradiation, a resistance change ratio is improved and thereby device characteristics can be improved.

10 Claims, 13 Drawing Sheets

(56) References Cited

PUBLICATIONS

Munisamy Subramanian, et al; "The effect of unintentional impurity related vibrational modes in ZnO thin films", ISPlasma Jan. 28, 2013-Feb. 1, 2013, Napoya, Japan 3 pages.

Dong Uk Lee, et al; "Electrical Properties of Metal-Oxide Quantum dot Hybrid Resistance Memory after 0.2-MeV-electron Beam Irradiation", The 44th Winter Annual Conference of the Korean Vacuum Society, Feb. 18, 2013; 5 pages.

* cited by examiner

METHOD OF MANUFACTURING RESISTANCE CHANGE LAYER USING IRRADIATION OF ELECTRON BEAM AND RESISTIVE RANDOM ACCESS MEMORY DEVICE USING THE SAME

CLAIM FOR PRIORITY

This application claims priority to Korean Patent Application No. 10-2013-0094637 filed on Aug. 9, 2013 in the Korean Intellectual Property Office (KIPO), the entire contents of which are hereby incorporated by reference.

BACKGROUND

1. Technical Field

Embodiments of the present invention relate to a method of manufacturing a resistance change layer and a method of manufacturing a resistive random access memory device. More specifically, embodiments of the present invention relate to a method of manufacturing a resistance change layer and a method of manufacturing a resistive random access memory device using electron beam irradiation.

2. Related Art

Since the late 1990s, application of memory devices has not been limited to a computer and has been expanded to a variety of electronic products. In addition, various kinds of memory devices are being developed in order to achieve high integration and high response speed.

Among those, a resistive random access memory device, that is, one of non-volatile memory devices is a device using a material capable of switching at least two different resistance states since a resistance rapidly changes depending on an applied voltage. Recently, the resistive random access memory device is in the spotlight for simplicity of a structure, stability, low power consumption, and high response speed, and since it can achieve high integration.

Generally, a resistive random access memory device is formed of a metal/insulator/metal (MIM) structure, and uses a non-volatile "resistance switching" phenomenon.

That is, a resistive random access memory device has two different resistance states at one voltage, and is operated by switching "on" or "off" using a low resistance state (LRS) and a high resistance state (HRS) and thereby storing 2-bit information. In addition, a resistive random access memory device has non-volatile characteristics in which, when a state is once changed, the state is continually maintained even when external power is not supplied, until a next switching occurs.

Depending on the characteristics of "on" or "off" switching operation, there are a unipolar resistive random access memory device in which both two resistance states are switched at one polarity, and a bipolar resistive random access memory device in which two resistance states are switched by changing a voltage polarity.

Currently, a charge trap type NAND flash memory device is difficult to be highly integrated any more due to a limitation in scaling. In addition, since a method in which electrons remain in a charge trap area by a tunneling technique using a tunnel insulating layer requires a high electric field, it is required to control decrease in an operation speed and variation in threshold voltages.

In addition, since a physical environment for manufacturing a highly integrated non-volatile memory device which is stably operated at 20 nm or less, reaches commercial limits, a non-volatile memory device with a different operation mechanism is needed.

In addition, a new manufacturing method is required to easily control a composition ratio of a resistance change layer when the resistance change layer including oxide semiconductors having different composition ratios.

SUMMARY

In accordance with an aspect of the present invention, a method of manufacturing a resistance change layer is provided. The method includes forming a preliminary resistance change layer including an oxide semiconductor material on a substrate, and irradiating the preliminary resistance change layer with an electron beam to a predetermined depth. On a path along which the electron beam is irradiated, a composition ratio of the resistance change layer changes in a direction in which a density of oxygen vacancies of the oxide semiconductor material increases.

In addition, the preliminary resistance change layer may include a quantum dot thereinside.

In addition, the process of forming the preliminary resistance change layer may include forming a first preliminary resistance change layer including an oxide semiconductor on the substrate, forming a quantum dot on the first preliminary resistance change layer, and forming a second preliminary resistance change layer including an oxide semiconductor on the first preliminary resistance change layer on which the quantum dot is formed.

In addition, the first preliminary resistance change layer may include a first oxide semiconductor layer and a first oxygen-deficient oxide semiconductor layer disposed on the first oxide semiconductor layer.

In addition, the second preliminary resistance change layer may include a second oxygen-deficient oxide semiconductor layer and a second oxide semiconductor layer disposed on the second oxygen-deficient oxide semiconductor layer.

In addition, the process of irradiating the preliminary resistance change layer with the electron beam to a predetermined depth may be performed in such a way that the electron beam is irradiated to a top of an area in which the quantum dot is located.

In addition, while the second preliminary resistance change layer is formed on the first preliminary resistance change layer, the quantum dot may have a core-shell structure.

In accordance with another aspect of the present invention, a method of manufacturing a resistive random access memory device is provided. The method includes forming a first electrode on a substrate, forming a first resistance change layer including an oxide semiconductor material on the first electrode, forming a quantum dot on the first resistance change layer, forming a second resistance change layer including an oxide semiconductor material on the first resistance change layer on which the quantum dot is formed, irradiating the second resistance change layer with an electron beam to a predetermined depth, and forming a second electrode on the second resistance change layer. A dislocation density of the second resistance change layer is decreased by irradiating the second resistance change layer with the electron beam.

In addition, the process of irradiating the second resistance change layer with the electron beam to the predetermined depth may be performed in such a way that the electron beam is irradiated to a top of an area in which the quantum dot is located.

In addition, the electron beam may be irradiated with energy of about 0.01 MeV to 0.2 MeV at a dose of about $1 \times 10^{14}$ e/cm$^2$ to $1 \times 10^{17}$ e/cm$^2$.

In addition, on a path along which the electron beam is irradiated, a composition ratio of the second resistance change layer may change in a direction in which a density of oxygen vacancies of the oxide semiconductor material increases,

DESCRIPTION OF EXAMPLE EMBODIMENTS

Figure 1:
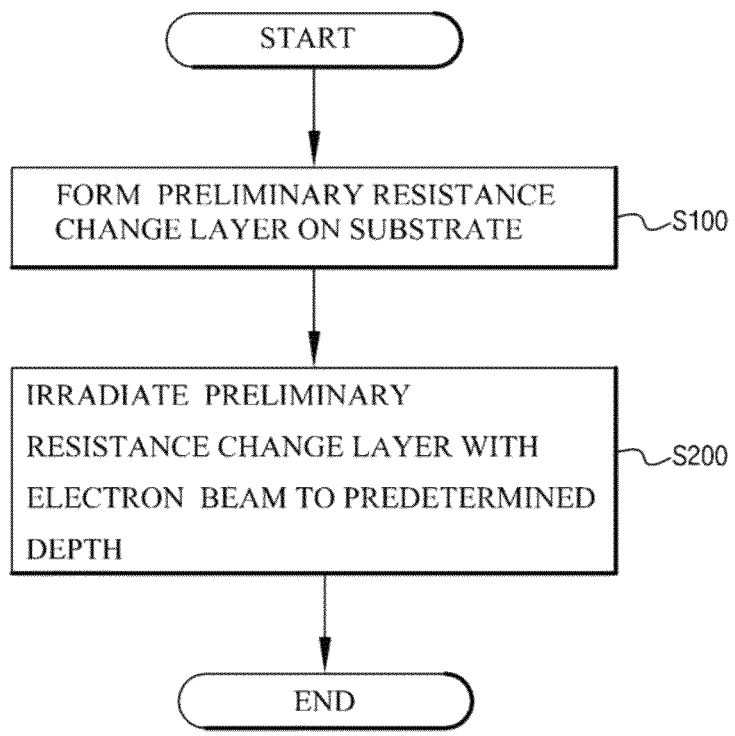
FIG. 1 is a process flowchart showing a method of manufacturing a resistance change layer using electron beam irradiation in accordance with an embodiment of the present invention.

Hereinafter, various embodiments will now be described more fully with reference to the accompanying drawings in which some embodiments are shown.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the appended claims.

It will be understood that when an element, such as a layer, a region, or a substrate, is referred to as being "on," another element, it can be directly on the other element or intervening elements may be present.

It will be understood that, although the terms first, second, etc. may be used herein to describe various elements, components, regions, layers, and/or sections, these elements, components, regions, layers, and/or sections should not be limited by these terms.

In addition, a term "A/B/C multilayered structure" is intended to mean "a structure in which a B layer and a C layer are sequentially disposed on an A layer."

FIG. 1 is a process flowchart showing a method of manufacturing a resistance change layer using electron beam irradiation in accordance with an embodiment of the present invention.

Referring to FIG. 1, the method of manufacturing a resistance change layer using electron beam irradiation includes forming a preliminary resistance change layer on a substrate (S100) and irradiating the preliminary resistance change layer to a predetermined depth with an electron beam (S200).

The process of forming the preliminary resistance change layer on the substrate (S100) may be performed using a physical vapor deposition (PVD) method, such as a sputtering method, a pulse laser deposition (PLD) method, a thermal evaporation method, or an electron-beam evaporation method, etc., a chemical vapor deposition (CVD) method, etc.

Here, the substrate is for supporting a device and may be a transparent inorganic material substrate selected from glass, quartz, and $Al_2O_3$, or a transparent organic material substrate selected from polyethylene terephthalate (PET), polyethersulfone (PES), polystyrene (PS), polycarbonate (PC), polyimide (PI), polyethylene naphthalate (PEN), and polyarylate (PAR).

In addition, the preliminary resistance change layer is a layer in which a conducting filament, which is a current flow path, is generated or dissipated according to voltage application through which currents flow, and may be formed by selecting from various materials having a resistance switching property.

For example, the preliminary resistance change layer may include an oxide semiconductor material. For example, the preliminary resistance change layer may include a binary metal oxide group or a perovskite oxide group. The binary metal oxide group may include $TiO_2$, $NiO$, $ZnO$, $HfO_2$, $SiO_2$, $ZrO_2$, $Al_2O_3$, $Y_2O_3$, $Ta_2O_5$, or $Nb_2O_5$, and the perovskite layer may include $SrTiO_3$, $BiFeO_3$, $BaTiO_3$, $LaMnO_3$, $SrMnO_3$, or $PrTiO_3$. In addition, the perovskite layer may include $Pr_{1-x}Ca_xMnO_3$ ($0 \le x \le 1$) or $La_{1-x}Ca_xMnO_3$ ($0 \le x \le 1$).

Characteristics of the process of irradiating the preliminary resistance change layer to a predetermined depth with an electron beam (S200) are in that, on a path along which the electron beam is irradiated, a composition ratio of the resistance change layer is changed in a direction in which a density of oxygen vacancies of the oxide semiconductor material of the resistance change layer increases.

That is, a kinetic energy of the electron beam is applied into the resistance change layer by the electron beam irradiation, and a density of oxygen vacancies of the oxide semiconductor material is increased by the kinetic energy.

For example, when a ZnO resistance change layer is irradiated by an electron beam, a density of oxygen vacancies of the ZnO resistance change layer may increase on a path along which the electron beam is irradiated. Accordingly, the composition ratio of the resistance change layer is changed from ZnO to $Zn_xO_{1-x}$ ($0.5 < x < 1$) to a penetration depth to which the electron beam is irradiated.

As a result, a resistance change layer having a $ZnO/Zn_xO_{1-x}$ thin film structure can be fabricated using the electron beam irradiation.

In addition to this, when a ZnO thin film is additionally stacked on the $ZnO/Zn_xO_{1-x}$ thin film, a resistance change layer having a $ZnO/Zn_xO_{1-x}/ZnO$ structure can be fabricated.

In addition, by controlling application energy and irradiation dose of the electron beam irradiation, the depth of penetration into the resistance change layer can be controlled.

For example, as the application energy of the electron beam increases, the depth of penetration into the resistance change layer may increase.

The electron beam may be irradiated in the energy of 0.01 MeV to 0.2 MeV. In addition, the electron beam may be irradiated at a dose of $1 \times 10^{14}$ e/cm$^2$ to $1 \times 10^{17}$ e/cm$^2$.

Meanwhile, in some cases, the preliminary resistance change layer may include a quantum dot thereinside.

In this case, the process of forming the preliminary resistance change layer on the substrate (S100) may include forming a first preliminary resistance change layer including an oxide semiconductor on the substrate, forming a quantum dot on the first preliminary resistance change layer, and forming a second preliminary resistance change layer including an oxide semiconductor on the first preliminary resistance change layer on which the quantum dot is formed.

Here, the first preliminary resistance change layer may include a first oxide semiconductor layer and a first oxygen-deficient oxide semiconductor layer disposed on the first oxide semiconductor layer.

In addition, the second preliminary resistance change layer may include a second oxygen-deficient oxide semiconductor layer and a second oxide semiconductor layer disposed on the second oxygen-deficient oxide semiconductor layer.

Here, while the second preliminary resistance change layer is formed on the first preliminary resistance change layer on which the quantum dot is formed, the quantum dot may have a core-shell structure. For example, when the quantum dot is an In quantum dot, and a second preliminary resistance change layer is a ZnO layer, an outer side of the In quantum dot is oxidized by ZnO to form an $In_2O_3$ shell.

For example, the preliminary resistance change layer may be $ZnO/Zn_xO_{1-x}/In$—$In_2O_3$ core-shell structured quantum dot/$Zn_xO_{1-x}/ZnO$.

Meanwhile, when the second preliminary resistance change layer including the oxide semiconductor is formed on the first preliminary resistance change layer on which the quantum dot is formed, there is a problem in that a dislocation density increases.

However, the increased dislocation density can be reduced back by irradiating the second preliminary resistance change layer with an electron beam.

In addition, when the quantum dot is located inside the preliminary resistance change layer, the irradiating of the preliminary resistance change layer with an electron beam to a predetermined depth (S200) is characterized in that the electron beam is irradiated to a top of an area in which the quantum dot is located.

If the electron beam is irradiated to the area in which the quantum dot is located, the quantum dot may be destroyed due to the electron beam.

Further, by applying the method of manufacturing a resistance change layer in accordance with the embodiment of the present invention, the process of forming a preliminary resistance change layer on a substrate and the process of irradiating the preliminary resistance change layer with an electron beam may be repeatedly performed to fabricate a multilayered resistance change layer having different compositions.

In addition, the density of oxygen vacancies of a resistance change material can be adjusted according to a depth of the resistance change layer, as desired, in such a way that the resistance change layer is repeatedly irradiated in different conditions of electron beam irradiation.

According to the embodiment of the present invention, the composition ratio of the resistance change layer may be easily controlled using electron beam irradiation.

In addition, since interfacial surface roughness and internal defect structure of the oxide semiconductor are controlled using electron beam irradiation, a resistance change ratio is improved and thereby device characteristics can be improved.

Figure 2:
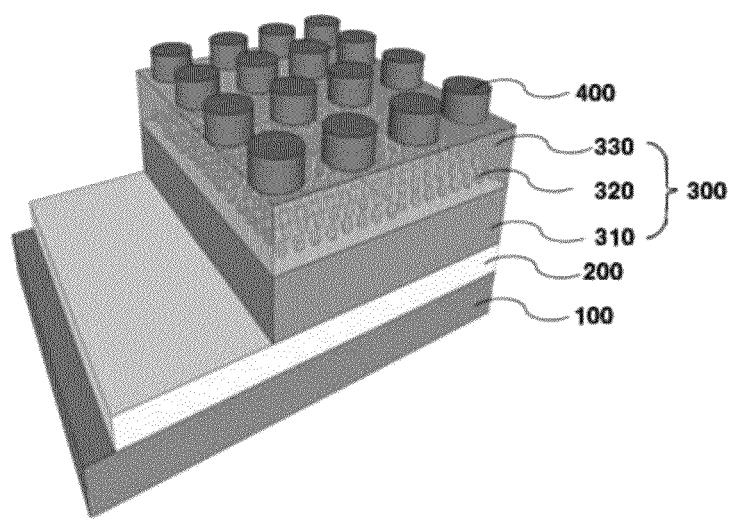
FIG. 2 is a schematic diagram showing a resistive random access memory device in accordance with an embodiment of the present invention.

FIG. 2 is a schematic diagram showing a resistive random access memory device in accordance with an embodiment of the present invention.

Referring to FIG. 2, the resistive random access memory device includes a substrate 100, a first electrode 200, a resistance change layer 300, and a second electrode 400.

The substrate 100 is for supporting a device and removable if necessary. For example, the substrate 100 may be a transparent inorganic material substrate selected from glass, quartz, and $Al_2O_3$, or a transparent organic material substrate selected from polyethylene terephthalate (PET), polyethersulfone (PES), polystyrene (PS), polycarbonate (PC), polyimide (PI), polyethylene naphthalate (PEN), and polyarylate (PAR). In some embodiments, a specific layer may be interposed between the substrate 100 and the first electrode 200 which is to be described later.

The first electrode 200 is located on the substrate 100. The first electrode 200 has conductivity and may include a metal-base material or a transparent conductive oxide. In particular, when the transparent conductive oxide is used, a transparent resistive random access memory device with high transmittance can be implemented. The metal may be Pt, Ru, Al, Ir, W, or Cu, and the transparent conductive oxide may be ITO, doped ZnO (AZO: Al-doped, GZO: Ga-doped, IZO: In-doped, IGZO: In— and Ga-doped, and MZO: Mg-doped), Al- or Ga-doped MgO, Sn-doped $In_2O_3$, F-doped $SnO_2$, or Nb-doped $TiO_2$. In addition, the first electrode 200 may include graphene.

The resistance change layer 300 is located on the first electrode 200. That is, the resistance change layer 300 may be interposed between the first electrode 200 and the second electrode 400.

The resistance change layer 300 is a layer in which a conducting filament, which is a current flow path, is generated or dissipated according to voltage application, and may be formed by selecting from various materials having a resistance switching property.

For example, the resistance change layer may include an oxide semiconductor material. For example, the resistance change layer 300 may include a binary metal oxide group or a perovskite oxide group. The binary metal oxide group may include $TiO_2$, NiO, ZnO, $HfO_2$, $SiO_2$, $ZrO_2$, $Al_2O_3$, $Y_2O_3$, $Ta_2O_5$, or $Nb_2O_5$, and the perovskite layer may include $SrTiO_3$, $BiFeO_3$, $BaTiO_3$, $LaMnO_3$, $SrMnO_3$, or $PrTiO_3$. In addition, the perovskite layer may include $Pr_{1-x}Ca_xMnO_3$ ($0 \leq x \leq 1$) or $La_{1-x}Ca_xMnO_3$ ($0 \leq x \leq 1$).

The resistance change layer may include at least one oxygen-deficient layer thereinside. For example, the resistance change layer may have a $ZnO/Zn_xO_{1-x}$ ($0.5<x<1$)/ZnO structure.

In addition, the resistance change layer 300 may include a quantum dot 320 thereinside.

That is, the resistance change layer 300 may include a first resistance change layer 310, the quantum dot 320, and a second resistance change layer 330.

In this case, the first resistance change layer 310 may include a first oxide semiconductor layer (not shown) and a first oxygen-deficient oxide semiconductor layer (not shown) disposed on the first oxide semiconductor layer. For example, the first resistance change layer 310 may have a $ZnO/Zn_xO_{1-x}$ ($0.5<x<1$) structure.

The quantum dot 320 may be located on the first resistance change layer 310. The quantum dot 320 traps charges at a quantum level in a deep quantum well, and functions to block or flow movement of charges depending on an applied voltage. The quantum dot 320 may include a metal, a metal silicide, a metal oxide or a metal oxide semiconductor, and may be formed as a single layer or a multilayer.

For example, the metal quantum dot 320 may be at least one selected from In, Au, Pt, Zn, Al, Co, W, Ni, Ag, Cd, Au, Ti, Sn, Te, Ge, Ga, Se, and Fe, the metal silicide quantum dot 320 may be at least one selected from CoSi, NiSi, WSi, TiSi, $V_3Si_2$, MnSi, $Cu_5Si$, CaSi, SrSi, YSi, $Mg_2Si$, $Ge_2Si$, $Sn_2Si$, $Pb_2Si$, $SrSi_2$, $ThSi_2$, and PtSi, and the metal oxide or metal oxide semiconductor quantum dot 320 may be at least one selected from $In_2O_3$, CuO, $Cu_2O_3$, PbO, $Bi_{12}SiO_{20}$, $ZnO_2$, $SnO_2$, GaO, MgO, GeO, $V_2O_5$, BaO, SrO, $Bi_{12}GeO_{20}$, $Bi_{12}SiO_{20}$, $Cd_2SnO_4$, $CdSnO_3$, GaO, and $Li_3CuO_3$.

In addition, the quantum dot may have a core-shell structure. For example, the quantum dot may be an In core-$In_2O_3$ shell structured quantum dot.

The second resistance change layer 330 is located on the first resistance change layer 310 on which the quantum dot 320 is located.

The second resistance change layer 330 may include a second oxygen-deficient oxide semiconductor layer (not shown) and a second oxide semiconductor layer (not shown) disposed on the second oxygen-deficient oxide semiconductor layer. For example, the second resistance change layer 330 may have a $Zn_xO_{1-x}$ ($0.5<x<1$)/ZnO structure.

The second electrode 400 is located on the resistance change layer 300. The second electrode 400 may have conductivity like the above-described first electrode 200, and may be selected from a metal group including Pt, Ru, Al, Ir, W, and Cu. In addition, the second electrode 400 may include graphene.

FIGS. 3 to 9 are schematic diagrams showing a method of manufacturing a resistive random access memory device in accordance with an embodiment of the present invention on the basis of a process sequence.

Figure 3:
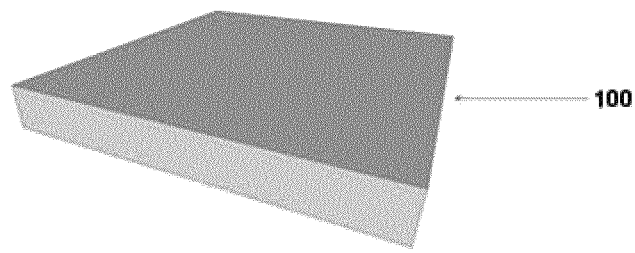
FIGS. 3 to 9 are schematic diagrams showing a method of manufacturing a resistive random access memory device in accordance with an embodiment of the present invention on the basis of a process sequence.

Referring to FIG. 3, first, a substrate 100 is prepared.

Figure 4:
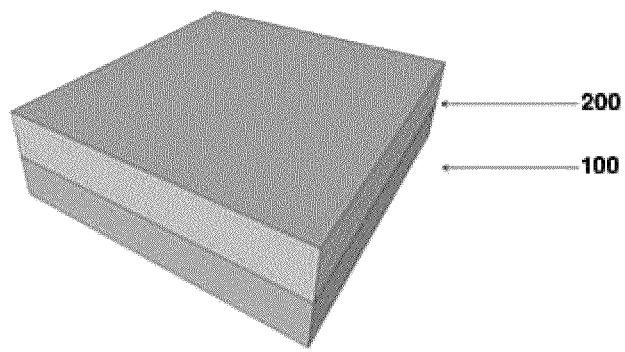

Referring to FIG. 4, a first electrode 200 is formed on the substrate 100. The first electrode 200 is formed using a thermal vapor deposition method, an electron beam deposition method, an RF sputtering method, a magnetron sputtering method, etc.

Figure 5:
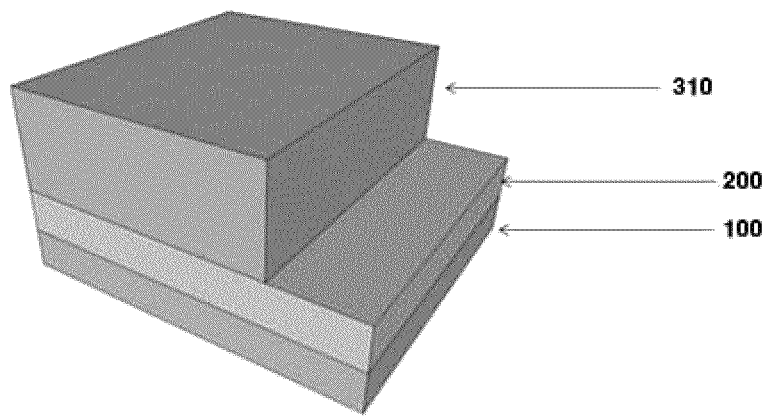

Referring to FIG. 5, a first resistance change layer 310 is formed on the first electrode 200. The first resistance change layer 310 may be formed using a physical vapor deposition (PVD) method, such as sputtering, pulse laser deposition (PLD), thermal evaporation, and electron beam evaporation, or a chemical vapor deposition (CVD).

Figure 6:
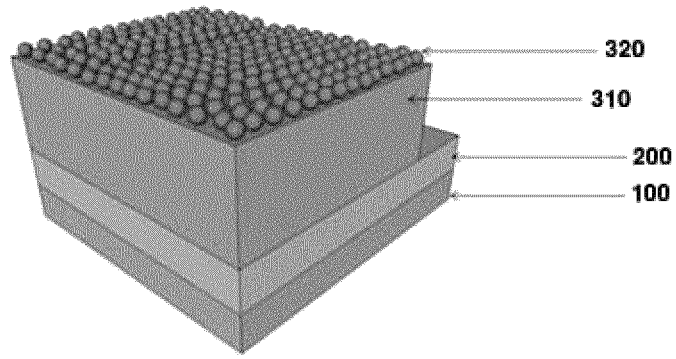

Referring to FIG. 6, a quantum dot is formed on the first resistance change layer 310. For example, an In metal layer may be stacked to have a thickness of 4 nm or less on the first resistance change layer 310 in order to form an In quantum dot. When the In metal layer is stacked to be thin, an In quantum dot 320 may be formed.

As another method of forming the quantum dot 320, a metal layer is formed on the first resistance change layer 310, and then a heat treatment is performed to form a quantum dot.

Figure 7:
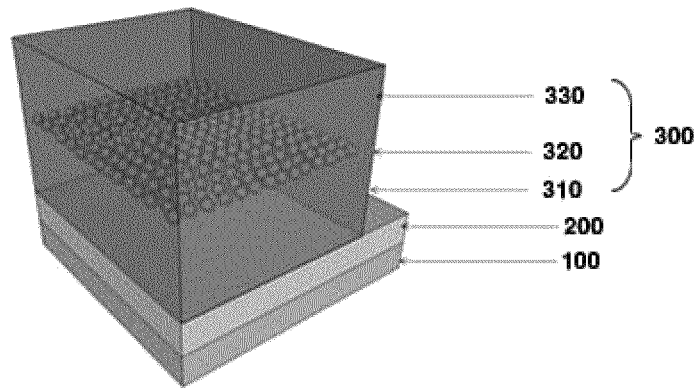

Referring to FIG. 7, a second resistance change layer 330 is formed on the first resistance change layer 310 having the quantum dot 320 formed thereon.

The second resistance change layer 330 may be formed using various methods like the above-described first resistance change layer 310.

Meanwhile, while the second resistance change layer 330 is formed on the first resistance change layer 310 having the quantum dot 320 formed thereon, the quantum dot 320 may have a core-shell structure.

For example, when the quantum dot 320 is an In quantum dot and the second resistance change layer 330 is a ZnO layer, the outer surface of the In quantum dot is oxidized due to ZnO while the second resistance change layer 330 is formed, to form an $In_2O_3$ shell.

Figure 8:
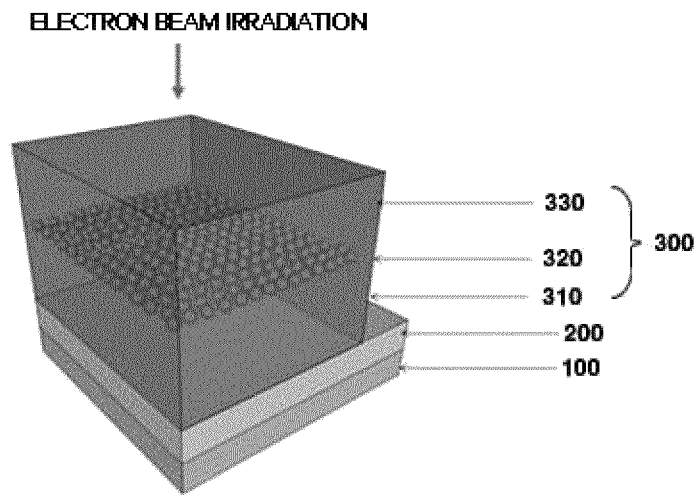

Referring to FIG. 8, the second resistance change layer 330 is irradiated with an electron beam.

The electron beam is irradiated in the energy of 0.01 MeV to 0.2 MeV. In addition, the electron beam is irradiated at a dose of $1 \times 10^{14}$ e/cm$^2$ to $1 \times 10^{17}$ e/cm$^2$.

Here, the electron beam is irradiated to a top of an area in which the quantum dot 320 is located.

If the electron beam is irradiated into the area in which the quantum dot 320 is located, the quantum dot 320 may be destroyed due to the electron beam.

Meanwhile, when the second resistance change layer 330 including an oxide semiconductor is formed on the first resistance change layer 310 on which the quantum dot 320 is formed, there is a problem in that a dislocation density increases.

However, the increased dislocation density can be reduced back by irradiating the second resistance change layer 330 with an electron beam.

Figure 9:
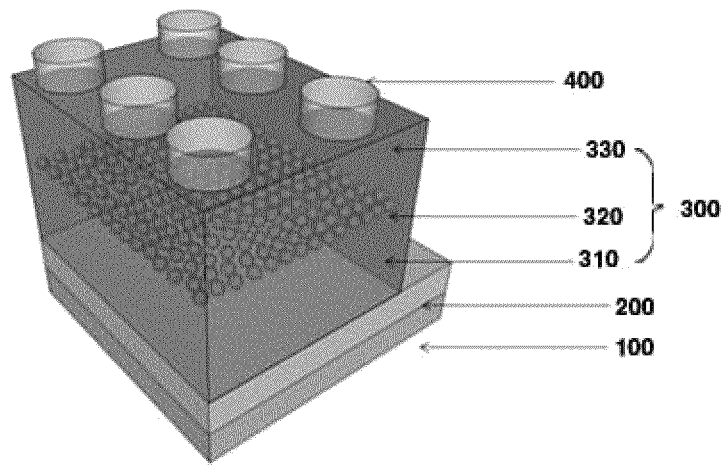

Referring to FIG. 9, a second electrode 400 is formed on the second resistance change layer 330 irradiated with the electron beam. The second electrode 400 may be formed by a thermal vapor deposition method, an electron beam deposition method, an RF sputtering method, a magnetron sputtering method, etc.

Comparative Example

A glass/Pt/ZnO/$Zn_xO_{1-x}$/ZnO/Pt structured thin film was formed by sequentially stacking a Pt electrode, a ZnO layer, a $Zn_xO_{1-x}$ layer, a ZnO layer, and a Pt electrode on a glass substrate.

In this case, a quantum dot is not included in a resistance change layer.

Specifically to describe the method of manufacturing the resistance change layer, a ZnO/$Zn_xO_{1-x}$/ZnO thin film was deposited to have a thickness of 150 nm on the Pt electrode using UHV sputtering.

First, a ZnO layer was deposited on the Pt electrode to have a thickness of 50 nm under a pressure of $2\times10^{-3}$ Torr at an Ar flow rate of 10 sccm at a room temperature.

Next, a $Zn_xO_{1-x}$ layer was deposited on the ZnO layer to have a thickness of 50 nm at 70 W in an atmosphere of 10 sccm Ar and 2 sccm $O_2$ using a reactive sputtering method.

After the deposition, a ZnO thin film was deposited on the $Zn_xO_{1-x}$ layer to have a thickness of 50 nm in an atmosphere of 10 sccm Ar gas. In this case, the ZnO thin film was deposited with the same 70 W.

Figure 10:
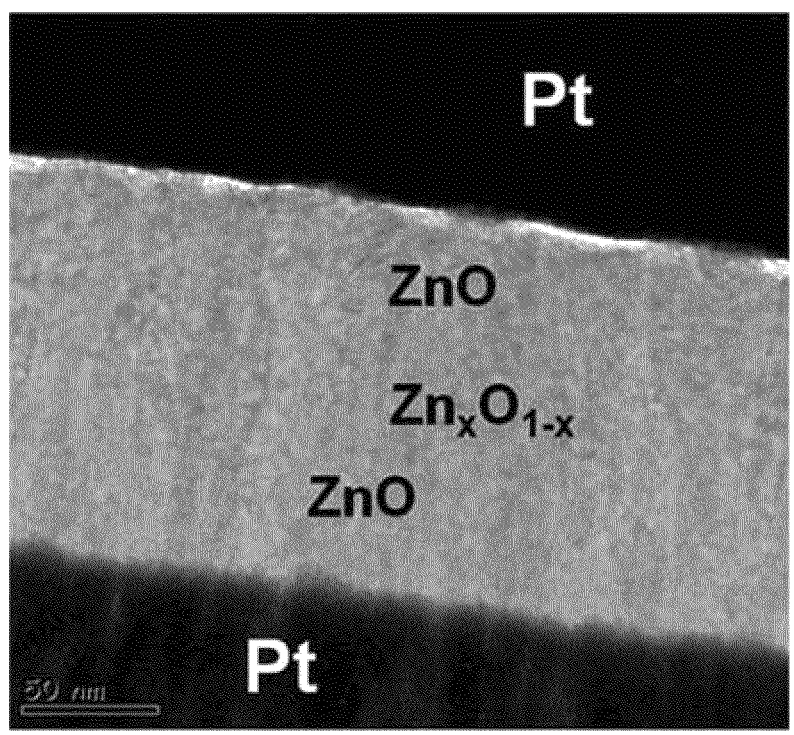
FIG. 10 is a cross-sectional TEM image of a ZnO/$Zn_xO_{1-x}$/ZnO thin film in accordance with Comparative Example.

FIG. 10 is a cross-sectional TEM image of the ZnO/$Zn_xO_{1-x}$/ZnO thin film in accordance with Comparative Example.

Referring to FIG. 10, it is found that the ZnO/$Zn_xO_{1-x}$/ZnO thin film is located between the Pt electrodes.

Figure 11:
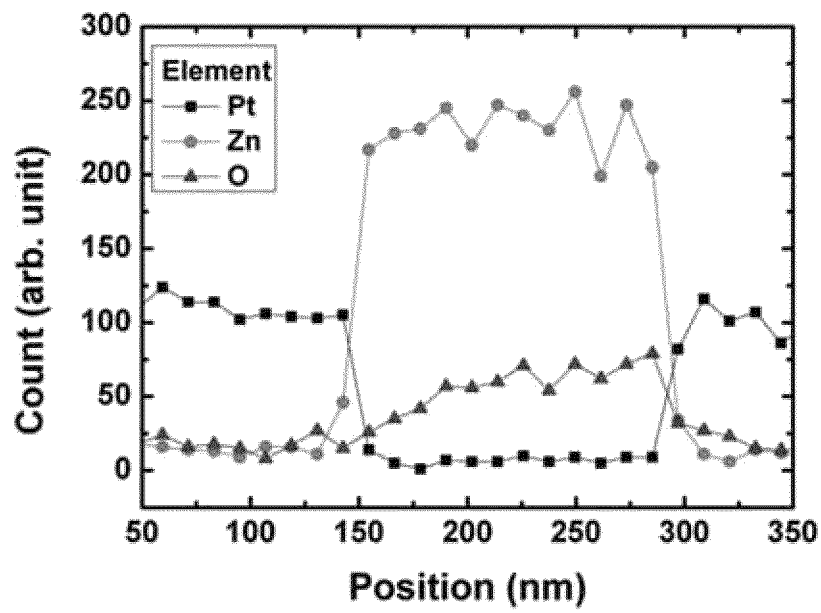
FIG. 11 is a graph showing an EDX depth profile for checking a composition ratio of a glass substrate/Pt/ZnO/$Zn_xO_{1-x}$/ZnO/Pt structure in accordance with Comparative Example.

FIG. 11 is a graph showing an EDX depth profile for checking a composition ratio of a glass substrate/Pt/ZnO/$Zn_xO_{1-x}$/ZnO/Pt structure in accordance with Comparative Example.

Referring to FIG. 11, a composition ratio of each of Pt, Zn, and O elements were analyzed to a depth of 150 nm from the Pt thin film in a TEM measurement for checking the EDX profile. As a result, it is found that a ZnO thin film with a thickness of 150 nm was formed between the Pt electrodes.

In particular, Zn and O ions were not detected in the Pt thin film, and it is found that there was no change of a chemical composition ratio at an interface since a reaction of Pt and $O_2$ was not found at the interface.

However, it is found that Zn is uniformly distributed in an area where the ZnO thin film was formed. On the contrary, O is distributed at a concentration of one-fifth of Zn. When the amount of injection of $O_2$ is changed to have an approximate composition ratio of $Zn_{0.85}O_{0.15}$, significant changes of $O_2$ in the deposited overall ZnO was not found.

Figure 12:
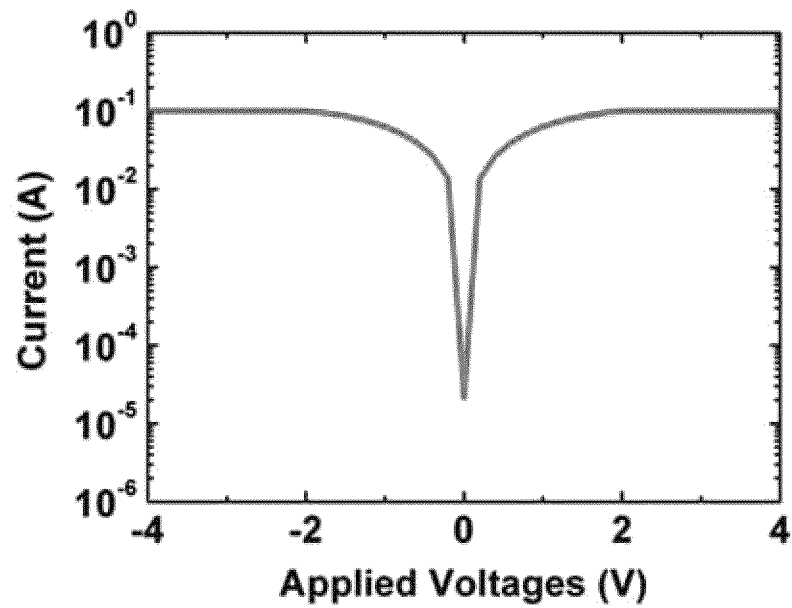
FIG. 12 is a graph showing current-voltage characteristics of a device in accordance with Comparative Example.

FIG. 12 is a graph showing current-voltage characteristics of a device in accordance with Comparative Example.

Referring to FIG. 12, when the voltage sweeps from 4V to −4V and from −4V to 4V, currents of $10^{-1}$ A flow and there is no change in resistance.

Accordingly, in the case of ZnO thin film which does not include a quantum dot, characteristics of a resistive random access memory are not found.

Manufacturing Example 1

A glass-substrate/Pt/ZnO/$Zn_xO_{1-x}$/In—$In_2O_3$ core-shell structured quantum dot/$Zn_xO_{1-x}$/ZnO/Pt resistive random access memory device in accordance with an embodiment of the present invention was fabricated.

A Pt electrode was deposited on the glass substrate using a DC sputtering method.

Next, a ZnO thin film was deposited on the Pt electrode to have a thickness of 50 nm in an atmosphere of 10 sccm Ar at 70 W using a UHV sputtering method.

Next, a $Zn_xO_{1-x}$ thin film was deposited to have a thickness of 50 nm in an atmosphere of 10 sccm Ar and 2 sccm $O_2$.

Next, an Indium (In) thin film was deposited on the $Zn_xO_{1-x}$ thin film to have a thickness of 5 nm in a vacuum of $5\times10^{-6}$ Torr using a thermal evaporator.

Next, a $Zn_xO_{1-x}$ thin film was deposited to have a thickness of 50 nm in an atmosphere of 10 sccm Ar and 2 sccm $O_2$.

Then, a ZnO thin film was deposited to have a thickness of 50 nm an atmosphere of 10 sccm Ar at 70 W using a UHV sputtering method.

Then, a Pt electrode was deposited using a DC sputtering method.

Figure 13:
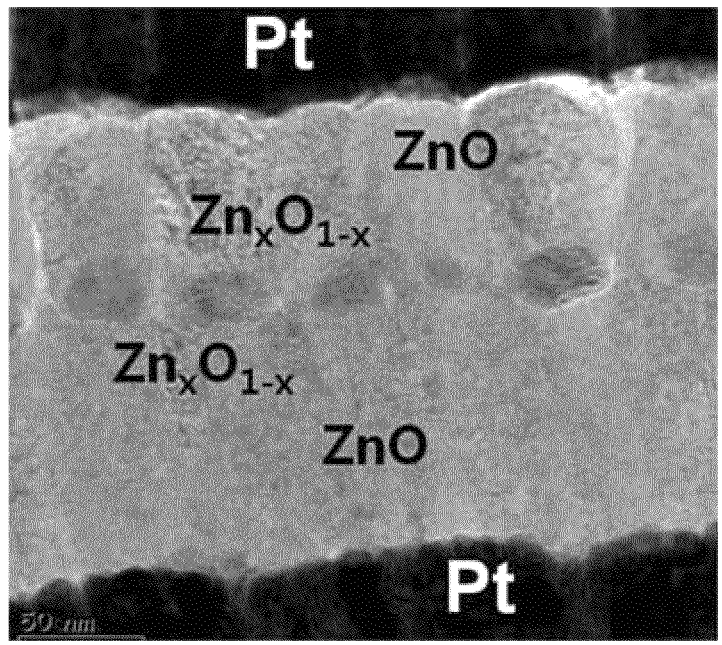
FIG. 13 is a cross-sectional TEM image of a resistive random access memory device in accordance with Manufacturing Example 1.

FIG. 13 is a cross-sectional TEM image of the resistive random access memory device in accordance with Manufacturing Example 1.

Referring to FIG. 13, it is found that a quantum dot was formed inside the ZnO resistance change layer. In addition, the quantum dot was formed in a single layer, and had a circular structure. In this case, the average size of the quantum dot is about 10 nm to 15 nm.

Figure 14:
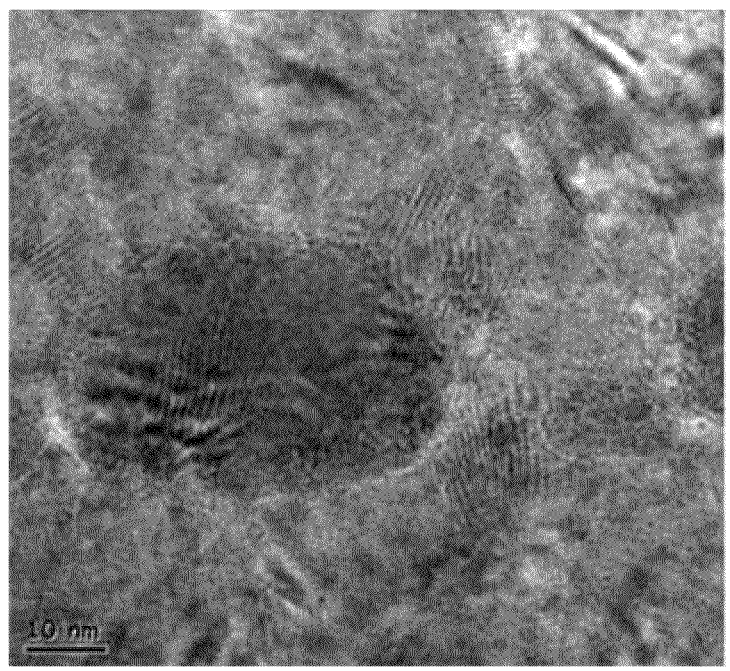
FIG. 14 is a high-resolution TEM image enlarged for checking a quantum dot of a resistive random access memory device in accordance with Manufacturing Example 1.

FIG. 14 is a high-resolution TEM image enlarged for checking a quantum dot of the resistive random access memory device in accordance with Manufacturing Example 1.

Referring to FIG. 14, a core-shell structured quantum dot with an inner In core and an outer $In_2O_3$ shell can be identified. That is, the quantum dot is formed by a process in which an In thin film deposited using a thermal evaporation method forms a seed at a point having a lowest chemical potential on a surface of ZnO. In this case, although the In quantum dot is not oxidized, an outer side of the In quantum dot is oxidized by ZnO while the ZnO thin film is deposited on the In quantum dot, to form the outer $In_2O_3$ shell.

Figure 15:
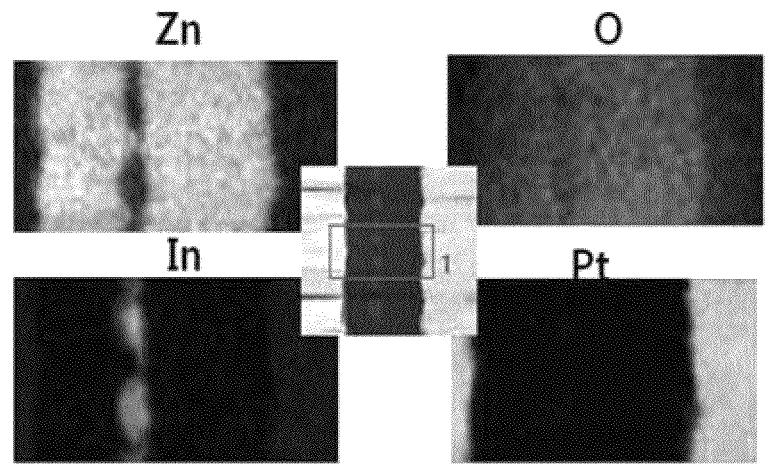
FIG. 15 shows EDS mapping images of a resistance change layer of a resistive random access memory device in accordance with Manufacturing Example 1, where composition ratios of elements are mapped.

FIG. 15 shows EDS mapping images of a resistance change layer of the resistive random access memory device in accordance with Manufacturing Example 1, where composition ratios of elements are mapped.

Referring to FIG. 15, it is found through EDX mapping that Zn elements are uniformly distributed except in the quantum dot and the Pt layer. In addition, O elements do not chemically react with Pt elements but is distributed only inside ZnO and in a portion where the In—$In_2O_3$ core-shell quantum dot exists.

In addition, through mapping of a composition ratio of In, it is found that In is formed in the quantum dot as a core.

In addition, through mapping of a composition ratio of Pt, it is found that Pt is distributed only in the Pt electrode.

Figure 16:
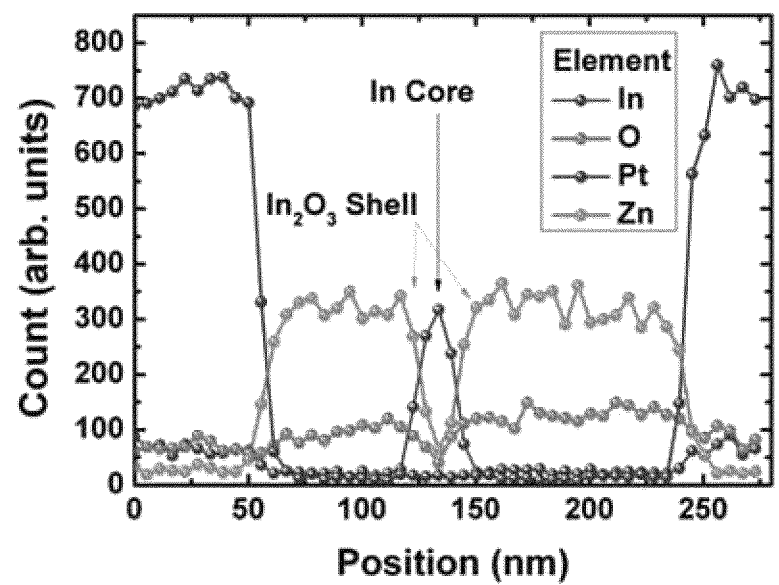
FIG. 16 is a graph showing an EDX depth profile of a resistive random access memory device in accordance with Manufacturing Example 1.

FIG. 16 is a graph showing an EDX depth profile of the resistive random access memory device in accordance with Manufacturing Example 1.

Referring to FIG. 16, Pt did not react with O at an interface therebetween. A ratio of O to Zn was not changed. The ratio of O to Zn was about 1:4, and in this case, a ratio of O was not changed even in an atmosphere of 2 sccm $O_2$.

In addition, In exists only in the center of the quantum dot having a diameter of 15 nm, and the $In_2O_3$ shell was formed in the outer side.

Manufacturing Example 2

Electron beam irradiation was performed to a glass substrate/Pt/ZnO/$Zn_xO_{1-x}$/In—$In_2O_3$ core-shell structured quantum dot/$Zn_xO_{1-x}$/ZnO structure fabricated by the same method as in Manufacturing Example 1.

An electron beam was irradiated with energy of 0.2 MeV at a dose of $1\times10^{14}$ $e/cm^2$. In this case, an electron beam irradiation time was 20 seconds.

In conditions of the electron beam irradiation, the energy of electron beam irradiation was determined using Monte Carlo Simulation.

That is, although the electron beam with 0.2 MeV passes through the ZnO thin film, most of energy is lost in the ZnO thin film. That is, electrons having kinetic energy transfer the kinetic energy to a lattice inside the ZnO to form a defect structure in the ZnO lattice.

Here, the irradiation time of the electron beam is proportional to the amount of dose. The shape of the quantum dot formed inside and the structure of the ZnO thin film was confirmed using a cross-sectional TEM image.

Figure 17:
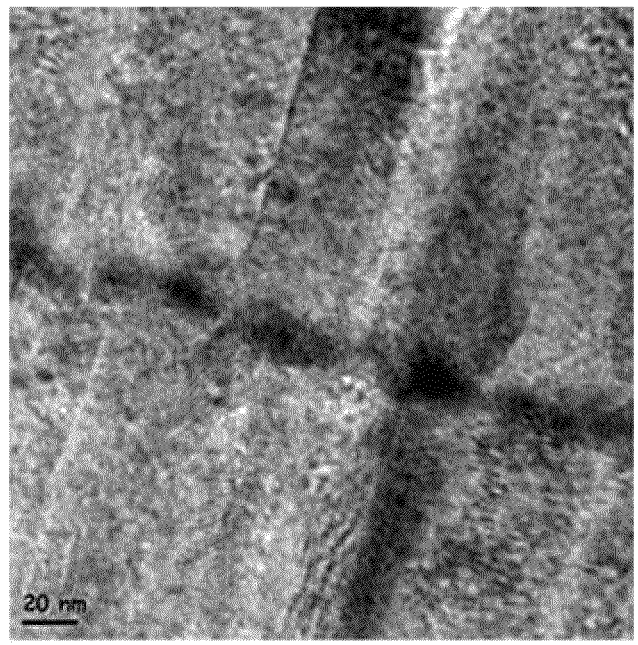
FIG. 17 is a high-resolution cross-sectional TEM image of a resistive random access memory device in accordance with Manufacturing Example 2.

FIG. 17 is a high-resolution cross-sectional TEM image of the resistive random access memory device in accordance with Manufacturing Example 2.

Referring to FIG. 17, it is found that a defect structure such as a dislocation was formed in the ZnO thin film formed on the quantum dot.

Here, the shape of the quantum dot formed inside was maintained after the electron beam irradiation.

Manufacturing Example 3

Electron beam irradiation was performed like in the above-described Manufacturing Example 2. However, the electron beam was irradiated with energy of 0.2 MeV at a dose of $1 \times 10^{15}$ e/cm$^2$. In this case, an electron beam irradiation time was 60 seconds.

Figure 18:
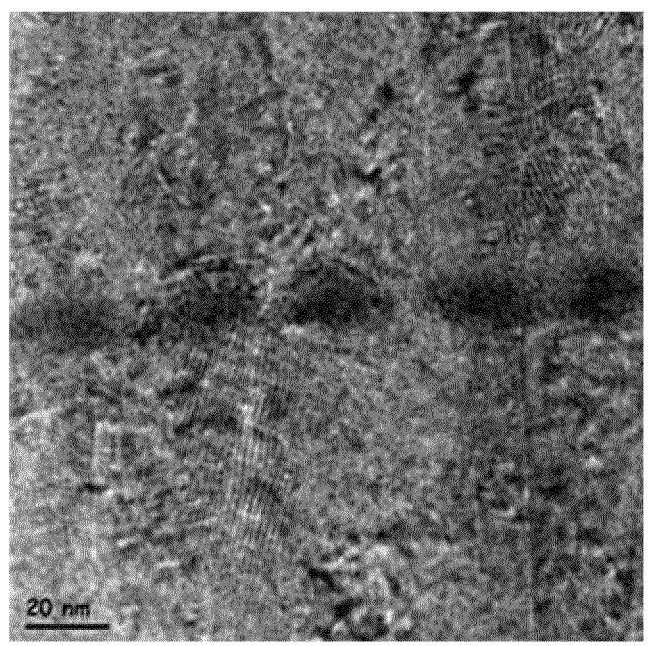
FIG. 18 is a high-resolution cross-sectional TEM image of a resistive random access memory device in accordance with Manufacturing Example 3.

FIG. 18 is a high-resolution cross-sectional TEM image of the resistive random access memory device in accordance with Manufacturing Example 3.

Referring to FIG. 18, the shape of the quantum dot formed inside was maintained after the electron beam irradiation.

Manufacturing Example 4

Electron beam irradiation was performed like in the above-described Manufacturing Example 2. However, the electron beam was irradiated with energy of 0.2 MeV at a dose of $1 \times 10^{16}$ e/cm$^2$. In this case, an electron beam irradiation time was 120 seconds.

At this time, a temperature of the device during the electron beam irradiation was 180° C., and the electron beam irradiation was performed in an O$_3$ atmosphere since the electron beam irradiation was performed in air.

Figure 19:
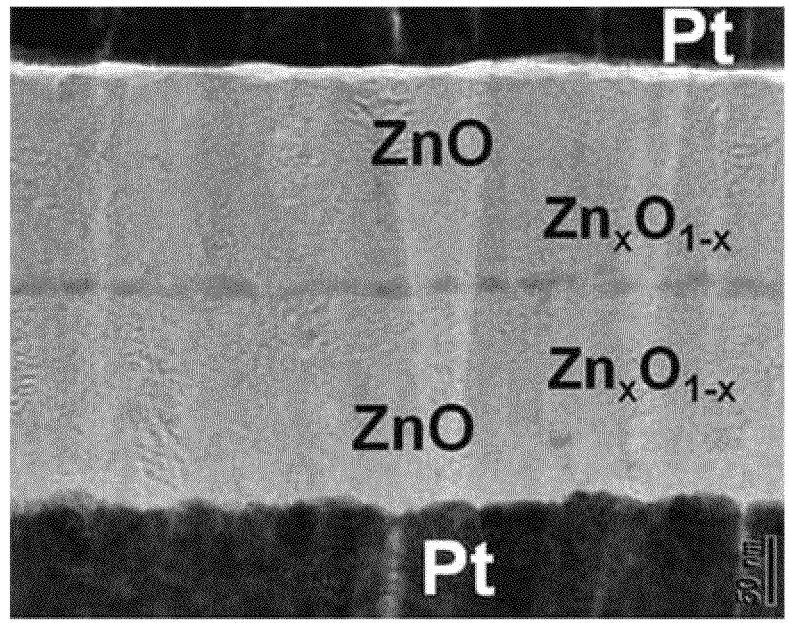
FIG. 19 is a cross-sectional TEM image of a resistive random access memory device in accordance with Manufacturing Example 4.

FIG. 19 is a cross-sectional TEM image of the resistive random access memory device in accordance with Manufacturing Example 4.

Referring to FIG. 19, there was no significant change in the density of dislocations when compared with that before the electron beam irradiation.

Figure 20:
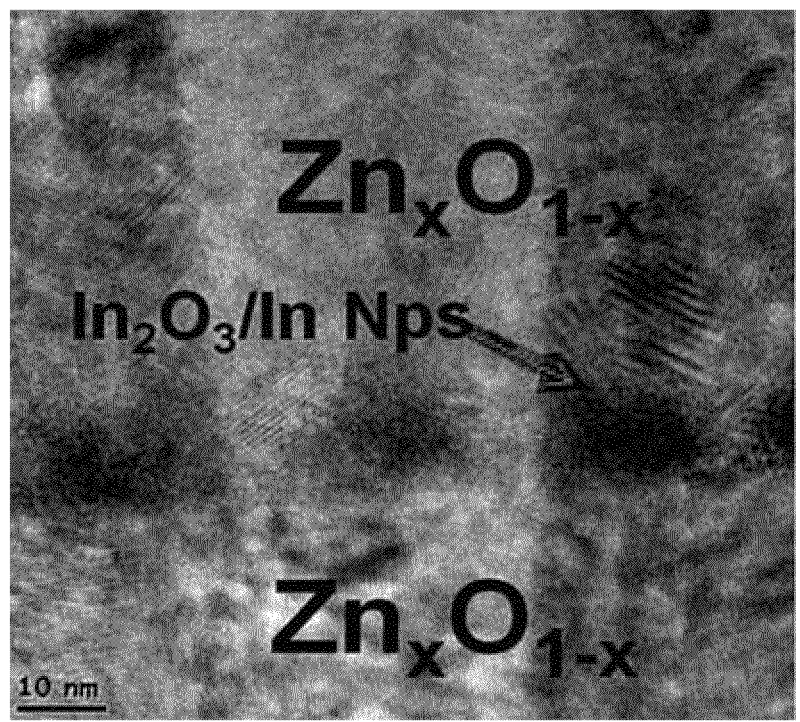
FIG. 20 is a high-resolution cross-sectional TEM image of a resistive random access memory device in accordance with Manufacturing Example 4.

FIG. 20 is a high-resolution cross-sectional TEM image of the resistive random access memory device in accordance with Manufacturing Example 4.

Referring to FIG. 20, the size of the quantum dot was about 10 nm. In addition, an inner In-core was found as before the electron beam irradiation, and an In$_2$O$_3$ oxide formed by oxidation due to ZnO was found in an outer circular quantum dot. That is, core-shell structured In—In$_2$O$_3$ nanoparticles (In$_2$O$_3$/In Nps) were formed.

In addition, it is found that dislocations were not formed on each quantum dot by the electron beam irradiation. That is, in the defect structure of the ZnO thin film growing from an edge of each quantum dot, features of dislocation formation were changed by the electron beam irradiation, that is, since the kinetic energy of accelerated electrons was transferred to an inside lattice. Accordingly, the dislocation density of the ZnO thin film can be reduced by the electron beam irradiation.

Figure 21:
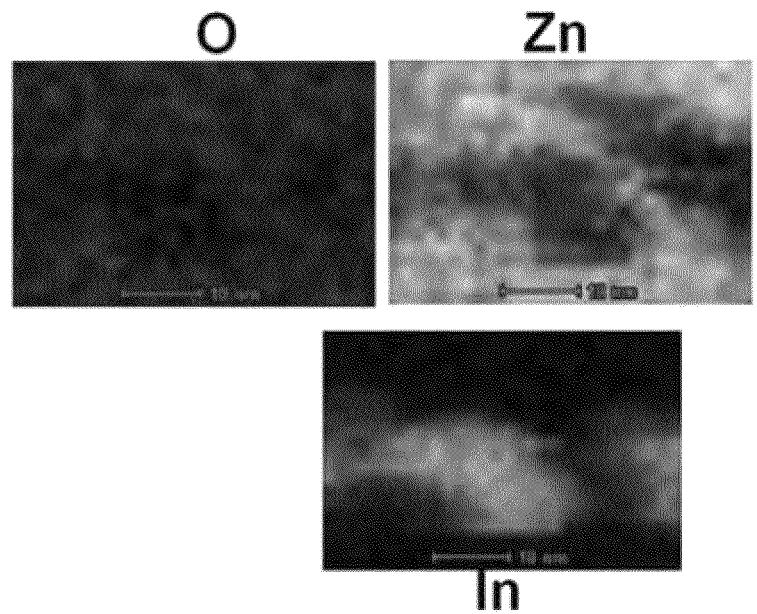
FIG. 21 shows EDS mapping images of a resistive random access memory device in accordance with Manufacturing Example 4, where composition ratios of elements are mapped.

FIG. 21 shows EDS mapping images of the resistive random access memory device in accordance with Manufacturing Example 4, where composition ratios of elements are mapped.

Referring to FIG. 21, it is found that a quantum dot including In and O was formed in the ZnO thin film.

Figure 22:
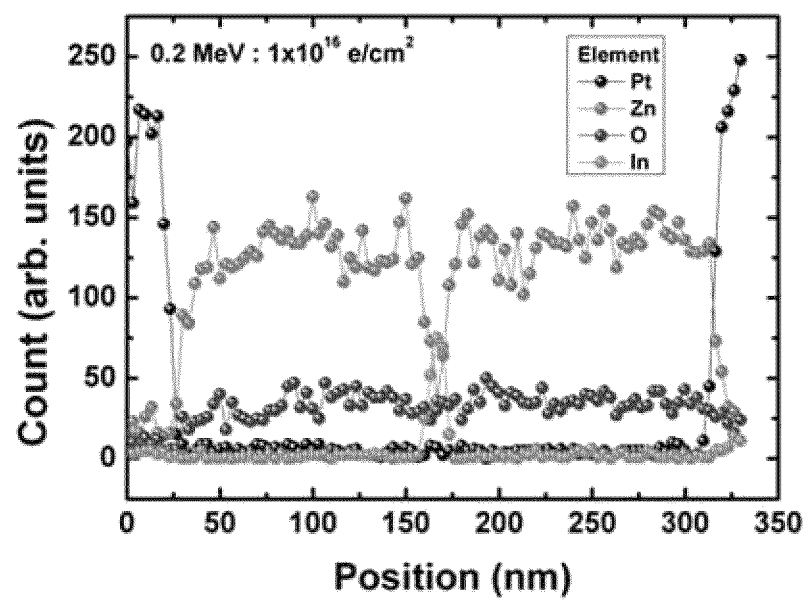
FIG. 22 is a graph showing an EDX profile of a resistive random access memory device in accordance with Manufacturing Example 4.

FIG. 22 is a graph showing an EDX profile of the resistive random access memory device in accordance with Manufacturing Example 4.

Referring to FIG. 22, distribution characteristics of O elements at the outside of the quantum dot having a diameter of 10 nm was checked. In this case, each composition ratio of ZnO was about ⅓ to ¼, which shows the ratio of oxygen increased than that before the electron beam irradiation. In this case, the composition ratio was $Zn_{0.75}O_{0.25}$.

That is, the increase of the ratio of oxygen is because the electron beam was irradiated in an O$_3$ atmosphere.

Accordingly, it is found that a composition ratio of the resistance change layer can be changed by electron beam irradiation.

Manufacturing Example 5

Electron beam irradiation was performed like in the above-described Manufacturing Example 2. However, the electron beam was irradiated with energy of 0.2 MeV at a dose of $1 \times 10^{17}$ e/cm$^2$. In this case, an electron beam irradiation time was 600 seconds.

Figure 23:
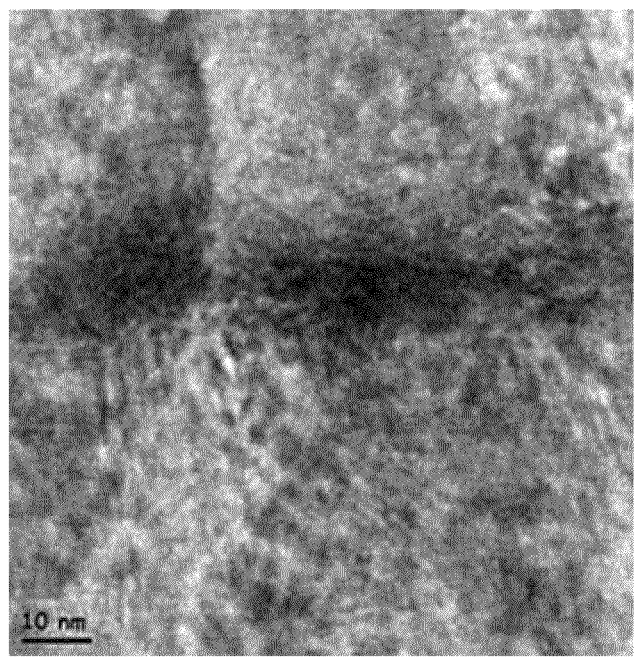
FIG. 23 is a high-resolution cross-sectional TEM image of a resistive random access memory device in accordance with Manufacturing Example 5.

FIG. 23 is a high-resolution cross-sectional TEM image of the resistive random access memory device in accordance with Manufacturing Example 5.

Referring to FIG. 23, an inner quantum dot do not maintain its shape and is diffused into other quantum dots to be connected each other.

Experimental Example

Characteristics of the resistive random access memory device in accordance with Manufacturing Example 4 were analyzed.

Figure 24:
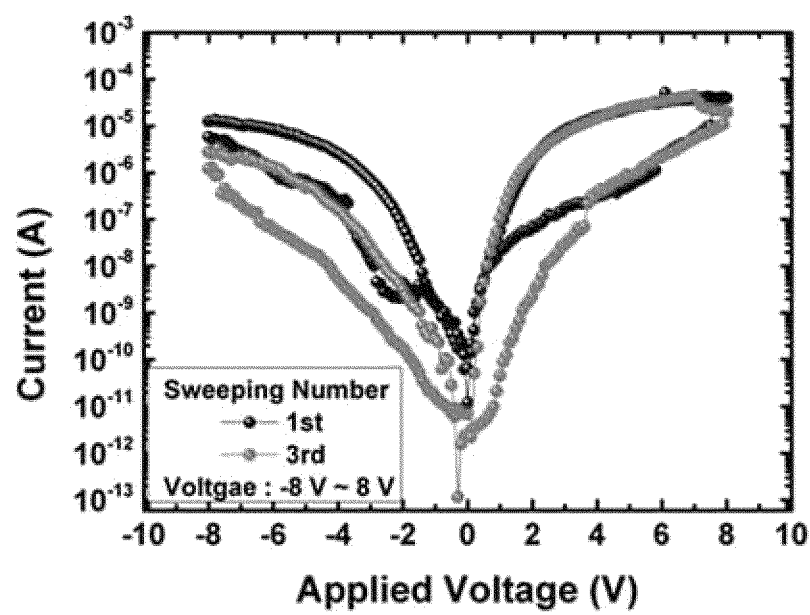
FIG. 24 is a graph showing current-voltage characteristics of a resistive random access memory device in accordance with Manufacturing Example 4.

FIG. 24 is a graph showing current-voltage characteristics of the resistive random access memory device in accordance with Manufacturing Example 4.

Referring to FIG. 24, current-voltage characteristics were analyzed while the voltage swept from 8 V to −8 V and from −8 V to 8 V.

Referring to FIG. 24, bipolar switching characteristics of currents were found as a result of the voltage sweep, and accordingly characteristics of the resistance change non-volatile memory using current bistability was shown.

Figure 25:
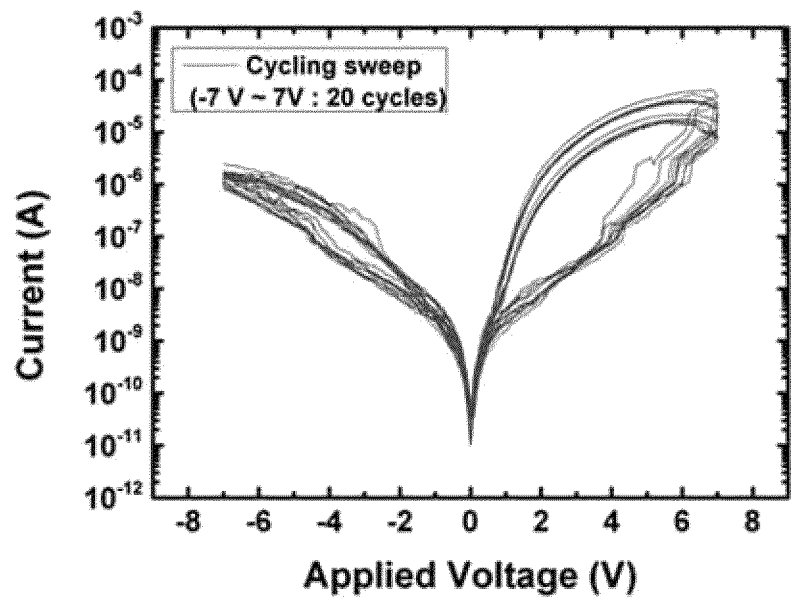
FIG. 25 is a graph showing current-voltage characteristics of a resistive random access memory device in accordance with Manufacturing Example 4.

FIG. 25 is a graph showing current-voltage characteristics of the resistive random access memory device in accordance with Manufacturing Example 4.

Referring to FIG. 25, current-voltage characteristics were analyzed after the voltage swept from 7 V to −7 V and from −7 V to 7 V for 20 cycles.

The applied voltage was decreased by 1V compared to the applied voltage in the above-described FIG. 24. Also in this case, the resistance variation characteristics are more stable and greater in a positive area than in a negative area.

In this case, the ratio of high resistance to low resistance was $6 \times 10^6$ when measured at 2 V.

When compared with the current-voltage characteristics of the resistive random access memory device including the quantum dot before the electron beam irradiation, the current-voltage characteristics were significantly improved, by $10^6$ times or more.

In addition, it is found that leakage currents were reduced and the overall current level was decreased after electron beam irradiation.

It is because a structure of defects in the ZnO thin film was changed by electron beam irradiation, and a density of internal dislocations or a level of internal defects was changed.

Figure 26:
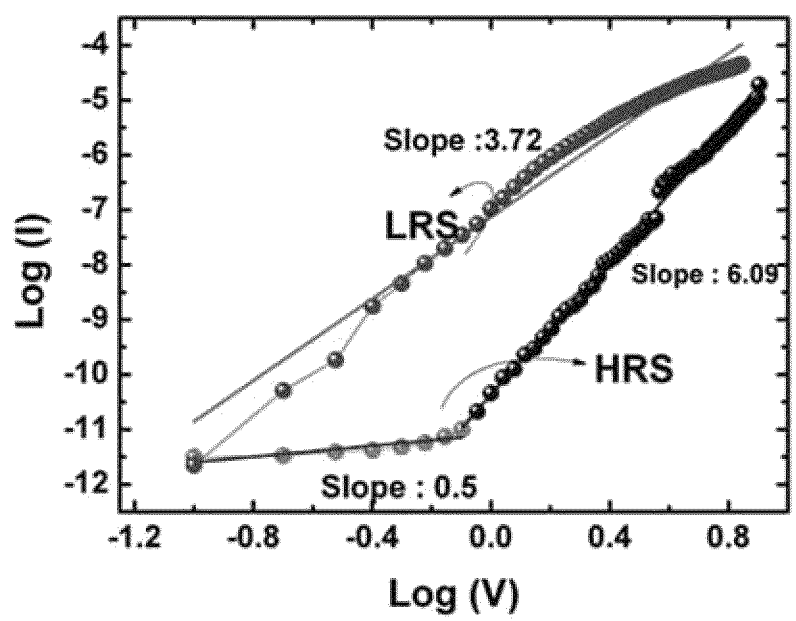
FIG. 26 is a graph showing log (I)-log (V) characteristics of a resistive random access memory device in accordance with Manufacturing Example 4.

FIG. 26 is a graph showing log (I)-log (V) characteristics of the resistive random access memory device in accordance with Manufacturing Example 4.

Referring to FIG. 26, it is found that a gradient at a low resistance state (LRS) was 3.72 and two conductive mechanisms were shown at a high resistance state (HRS).

A slope at a low electric field was 0.5, which is attributed to an ohmic effect or a thermal emission effect.

A slope at a high electric field was 6.09, which is considered because a space charge limited current (SCLC) effect and a tunneling effect due to a high electric field were implemented at the same time.

It is because internal dislocations were reduced by electron beam irradiation, and filaments were formed due to non-uniform changes in an energy level of a quantum well structure formed by the quantum dot or in a density of $O^{2-}$ formed at an outside of the $In_2O_3$ quantum dot.

Figure 27:
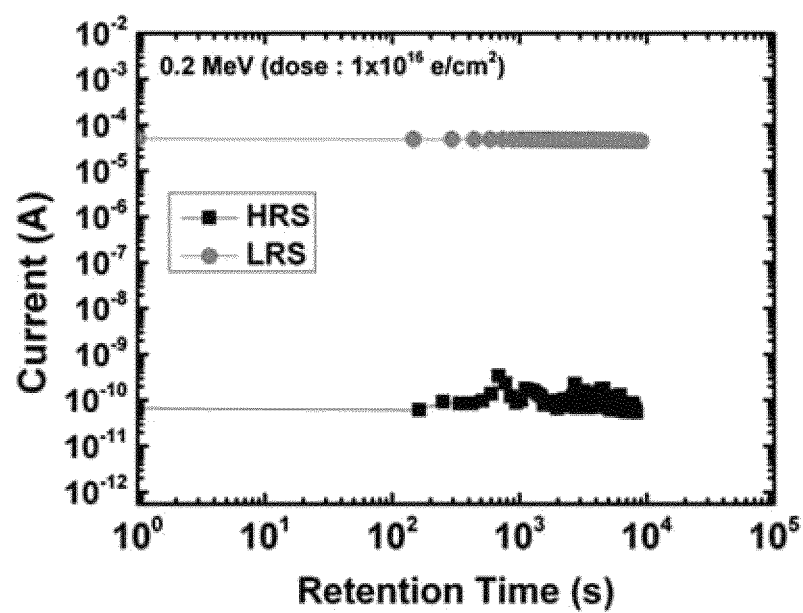
FIG. 27 is a graph showing retention characteristics of a resistive random access memory device in accordance with Manufacturing Example 4.

FIG. 27 is a graph showing retention characteristics of the resistive random access memory device in accordance with Manufacturing Example 4.

Referring to FIG. 27, it is found that the ratio of high resistance to low resistance at a measured voltage (2 V) was $10^6$ or more, which was maintained after a retention time of $10^4$ s.

In this case, the fabricated device can be applied as a non-volatile memory device. Even when a state of currents is changed, information is maintained with no loss by determining a state in which the information can be stored.

While the example embodiments of the present invention and their advantages have been described with reference to the accompanying drawings, specific structural and functional details disclosed herein are merely representative for purposes of describing example embodiments of the present invention, and it should not be construed as limited to the embodiments set forth herein. It will be apparent to those skilled in the art that various modifications can be made to the above-described exemplary embodiments of the present invention without departing from the spirit or scope of the invention.

[Description of the Main Parts of the Drawings]

| | |
|---|---|
| 100: substrate | 200: first electrode |
| 300: resistance change layer | 310: first resistance change layer |
| 320: quantum dot | 330: second resistance change layer |
| 400: second electrode | |

What is claimed is:

1. A method of manufacturing a resistance change layer, comprising:
   forming a preliminary resistance change layer including an oxide semiconductor material on a substrate; and
   irradiating the preliminary resistance change layer with an electron beam to a predetermined depth to form a resistance change layer,
   wherein, on a path along which the electron beam is irradiated, a composition ratio of the resistance change layer changes in a direction in which a density of oxygen vacancies of the oxide semiconductor material increases.

2. The method of claim 1, wherein a quantum dot is included inside of the preliminary resistance change layer.

3. The method of claim 2, wherein the forming of the preliminary resistance change layer comprises:
   forming a first preliminary resistance change layer including an oxide semiconductor on the substrate;
   forming a quantum dot on the first preliminary resistance change layer; and
   forming a second preliminary resistance change layer including an oxide semiconductor on the first preliminary resistance change layer on which the quantum dot is formed.

4. The method of claim 3, wherein the first preliminary resistance change layer includes a first oxide semiconductor layer and a first oxygen-deficient oxide semiconductor layer disposed on the first oxide semiconductor layer,
   wherein the second preliminary resistance change layer includes a second oxygen-deficient oxide semiconductor layer and a second oxide semiconductor layer disposed on the second oxygen-deficient oxide semiconductor layer.

5. The method of claim 3, wherein while the second preliminary resistance change layer is formed on the first preliminary resistance change layer, the quantum dot has a core-shell structure.

6. The method of claim 2, wherein the irradiating of the preliminary resistance change layer with the electron beam to a predetermined depth is performed in such a way that the electron beam is irradiated to a top of an area in which the quantum dot is located.

7. A method of manufacturing a resistive random access memory device, comprising:
   forming a first electrode on a substrate;
   forming a first resistance change layer including an oxide semiconductor material on the first electrode;
   forming a quantum dot on the first resistance change layer;
   forming a second resistance change layer including an oxide semiconductor material on the first resistance change layer on which the quantum dot is formed;
   irradiating the second resistance change layer with an electron beam to a predetermined depth; and
   forming a second electrode on the second resistance change layer,
   wherein a dislocation density of the second resistance change layer is decreased by irradiating the second resistance change layer with the electron beam.

8. The method of claim 7, wherein the irradiating of the second resistance change layer with the electron beam to the predetermined depth is performed in such a way that the electron beam is irradiated to a top of an area in which the quantum dot is located.

9. The method of claim 7, wherein the electron beam is irradiated with an energy of about 0.01 MeV to 0.2 MeV at a dose of about $1\times10^{14}$ e/cm$^2$ to $1\times10^{17}$ e/cm$^2$.

10. The method of claim 7, wherein, on a path along which the electron beam is irradiated, a composition ratio of the second resistance change layer changes in a direction in which a density of oxygen vacancies of the oxide semiconductor material increases.

* * * * *